United States Patent
McCartney et al.

(10) Patent No.: US 6,697,006 B1
(45) Date of Patent: Feb. 24, 2004

(54) CONDITIONING CIRCUIT FOR SELECTIVELY BUFFERING AN INPUT SIGNAL TO A SIGNAL PROCESSING CIRCUIT, AND A SIGNAL PROCESSING CIRCUIT INCORPORATING THE CONDITIONING CIRCUIT

(75) Inventors: Damien Joseph McCartney, Limerick (IE); Adrian Sherry, Dublin (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/263,614

(22) Filed: Oct. 3, 2002

Related U.S. Application Data (60) Provisional application No. 60/326,821, filed on Oct. 3, 2001.

(51) Int. Cl.[7] ................................................ H03M 1/12
(52) U.S. Cl. ........................................ 341/155; 341/143
(58) Field of Search ................................ 341/122, 155, 341/143

(56) References Cited

U.S. PATENT DOCUMENTS

| | | | | |
|---|---|---|---|---|
| 4,973,579 A | * | 11/1990 | Alexander et al. | 514/49 |
| 5,422,643 A | * | 6/1995 | Chu et al. | 341/141 |
| 5,675,334 A | | 10/1997 | McCartney | 341/118 |
| 6,380,801 B1 | | 4/2002 | McCartney | 330/9 |
| 6,446,102 B1 | * | 9/2002 | Kryger et al. | 708/208 |

OTHER PUBLICATIONS

Johnston, J., "Switched–Capacitor A/D Converter Input Structures", Application Note, Crystal Semiconductor Corporation 1996, pp. 1–6.

* cited by examiner

*Primary Examiner*—Peguy JeanPierre
(74) *Attorney, Agent, or Firm*—Wolf, Greenfield & Sacks, P.C.

(57) ABSTRACT

A signal processing circuit comprising an ADC (5) to which differential signals and pseudo-differential signals are switched through two multiplexors (8) and (9). Positive input signals are buffered to a positive input terminal (6) of the ADC (5) through a buffer (12). Negative input signals are buffered through a conditioning circuit (15) to a negative input terminal (7) of the ADC (5). The conditioning circuit (15) comprises a buffer circuit (16) having a buffer (18), through which input signals are selectively buffered to the negative input terminal (7) of the ADC (5), and a bypass circuit (17) which bypasses the buffer circuit (18) for selectively passing input signals unbuffered to the negative input terminal (7) of the ADC 5. First and second primary switches (19) and (20) are selectively operated in response to a primary switching signal from a control circuit (21) for selecting one of the buffer circuit (16) and the bypass circuit (17) in response to channel select signals for the multiplexors (8) and (9) so that input signals, the voltage of which falls outside the operating voltage of the buffer (18) are passed unbuffered directly to the negative input terminal (7) through the bypass circuit (17). The control circuit (21) instead of being responsive to a channel select signal may be arranged to be responsive to the voltage of the input signals for operating the first and secondary primary switches (19,20). Two conditioning circuits (15) may be provided one for each input terminal to the ADC (5).

34 Claims, 5 Drawing Sheets

CONDITIONING CIRCUIT FOR SELECTIVELY BUFFERING AN INPUT SIGNAL TO A SIGNAL PROCESSING CIRCUIT, AND A SIGNAL PROCESSING CIRCUIT INCORPORATING THE CONDITIONING CIRCUIT

This application claims the benefit of provisional application Ser. No. 60/326,821 filed Oct. 3, 2001.

FIELD OF THE INVENTION

The present invention relates to a conditioning circuit for selectively buffering an input signal to a signal processing circuit for subsequent processing thereof, and in particular though not limited to a conditioning circuit for selectively buffering an input signal to an analog-to-digital converter. The invention also relates to a signal processing circuit comprising the conditioning circuit, and to an analog-to-digital converter circuit comprising the conditioning circuit.

In this specification the terms differential and pseudo-differential are used in connection with input signals. Differential signals are of the type which require two terminals per signal, since the signal is represented as the difference between the voltages on two terminals. The two terminals are respectively referred to as the positive and negative terminals. An example of a differential signal, is one which is sourced from a circuit of bridge configuration where the differential signal swings around a mid-point or reference voltage of $V_{bridge}/2$, where $V_{bridge}$ is the voltage applied to the bridge, The voltages of a differential signal generally do not approach the respective supply rail voltages of a circuit, and have a source impedance arising from resistors which form the bridge circuit. Pseudo-differential signals are signals which share a common terminal, which may be negative or positive but generally is negative. Thus, pseudo-differential signals require N+1 terminals per N signals. Commonly, pseudo-differential signals are also referred to as single-ended signals. Additionally, in this specification a reference to a positive signal is intended to mean a reference to the signal applied to the positive terminal, and a reference to a negative signal is intended to mean a reference to the signal applied to the negative terminal. For differential signals the term positive or negative is a convention, rather than being indicative of polarity. If the positive signal is greater than the negative signal, then the differential signal has a positive polarity, Conversely, if the positive signal is less than the negative signal, the differential signal has a negative polarity. For pseudo-differential signals, the negative signal is normally at or close to ground, and the positive signal is above the negative signal, thus giving a pseudo-differential signal of positive polarity.

BACKGROUND TO THE INVENTION

Signal processing circuits, for example, analog-to-digital converter (ADC) circuits, and in particular, sigma-delta ADC circuits, in general, present a low impedance to an input signal to be processed when applied to input terminals of the ADC circuit. This causes current to flow to or from the input terminals of the ADC circuit, thus leading to a change in voltage of the input signal. This is a particularly serious problem where the input signal is derived from a high impedance source, which is high relative to the impedance presented by the ADC circuit. Any significant change in the voltage of an input signal when it is applied to an ADC circuit or other signal processing circuit is undesirable, Buffers are commonly used to overcome this problem. A buffer presents a high impedance to an input signal, and buffers are selected so that the input impedance of the buffer is high relative to that of the source impedance of the input signal, thus, leading to minimal change in the voltage of the input signal when applied to the buffer. However, buffers suffer from a number of disadvantages. They tend to add noise and other distortions to the input signal, and the output voltage from a buffer may be offset from the input voltage. Most importantly, buffers in general, can only operate over a limited input voltage range, They are unsuitable for buffering input signals the voltage of which is relatively close to either the positive or negative supply voltage to the buffer. Where the voltage of an input signal is relatively close to the positive or negative supply voltage to the buffer the problems of noise and distortion as well as voltage offset become unacceptable. Indeed, in general, the problem of noise, distortion and voltage offset occurs over a voltage range which is close to one of the positive or negative supply voltages of the buffer, rather than the other. In other words, buffers, in general, can operate with input signal voltages closer to one of the supply voltages of the buffer than the other supply voltage. This, in general, results from the type of transistors with which the input stage of the buffer is implemented. If the input stage of the buffer is implemented in PMOS transistors, the voltage range, over which the buffer can operate, in general, extends doser to the negative supply voltage of the buffer than to the positive supply voltage, and vice versa when the input stage is implemented in NMOS transistors. In other words, when the input stage is implemented in NMOS transistors, the voltage range, over which the buffer can operate, in general, extends closer to the positive supply voltage of the buffer than to the negative supply voltage.

Where a differential input signal is buffered to an ADC circuit, the problems which have just been discussed relating to buffers may not arise, since the positive and negative component signals of the differential signal vary on either side of a reference voltage, which can be selected to lie in the middle of the operating voltage range of the buffer, and the buffer can be selected so that the positive and negative voltage extremes of the positive and negative component signals of the differential signal remain within the operating voltage range of the buffer. However, where an ADC circuit, or indeed any other signal processing circuit must be capable of handling both differential signals, and pseudo-differential signals, and the common voltage of the pseudo-differential signals is relatively close to one or other of the positive or negative supply voltage of the buffer, buffering of the respective input signals is unsatisfactory. This is due to the fact that the buffered output of the common input signal will be unsuitable for further processing as a result of noise, distortion and/or voltage offset introduced by the buffer.

There is therefore a need for a conditioning circuit for selectively buffering an input signal to an ADC circuit, and indeed, to other signal processing circuits for processing the input signals, which overcomes these problems.

The present invention is directed towards providing such a conditioning circuit, as well as a signal processing circuit and an ADC circuit both of which comprise the conditioning circuit.

SUMMARY OF THE INVENTION

According to the invention there is provided a conditioning circuit for selectively buffering an input signal to a signal processing circuit, the conditioning circuit comprising:

a buffer circuit for receiving and buffering the input signal, a bypass circuit for receiving the input signal, and for bypassing the buffer circuit, and a control circuit for selecting one of the buffer circuit and the bypass circuit for passing the input signal to the signal processing circuit, so that the input signal is applied to the signal processing circuit through the bypass circuit when the voltage of the input signal falls outside the operating voltage range of the buffer circuit.

In one embodiment of the invention a plurality of input signals are selectively applied to the conditioning circuit, and the control circuit is responsive to which of the input signals is selected for selecting the one of the buffer circuit and the bypass circuit. Preferably, the signals are applied to the conditioning circuit in response to a select signal, and the control circuit is responsive to the select signal for selecting the one of the buffer circuit and the bypass circuit.

In another embodiment of the invention the control circuit is responsive to the input signal for selecting the one of the buffer circuit and the bypass circuit In another embodiment of the invention the control circuit is responsive to the voltage of the input signal for selecting the one of the buffer circuit and the bypass circuit.

In one embodiment of the invention the control circuit comprises a primary comparing circuit for comparing the voltage of the input signal with a reference voltage for determining if the voltage of the input signal is within the operating voltage range of the buffer circuit, and the control circuit is responsive to the primary comparing circuit for selecting the one of the buffer circuit and the bypass circuit. Preferably, the primary comparing circuit comprises a first primary comparator for comparing the voltage of the input signal with a first reference voltage for determining if the voltage of the input signal exceeds an upper operating voltage limit of the operating voltage range of the buffer circuit, and a second primary comparator for comparing the voltage of the input signal with a second reference voltage for determining if the voltage of the input signal is below a lower operating voltage limit of the operating voltage range of the buffer circuit, the first reference voltage being higher than the second reference voltage.

In another embodiment of the invention the buffer circuit comprises a first buffer circuit and a second buffer circuit connected in parallel, the first and second buffer circuits having respective overlapping operating voltage ranges, the operating voltage range of the first buffer circuit having an upper operating voltage limit higher than the upper operating voltage limit of the second buffer circuit, and the operating voltage range of the second buffer circuit having a lower operating voltage limit lower than the lower operating voltage limit of the first buffer circuit, the respective first and second buffer circuits being alternately selectable so that if the voltage of the input signal exceeds the upper operating voltage limit of the second buffer circuit, the input signal is passed through the first buffer circuit, and if the voltage of the input signal falls below the lower operating voltage limit of the first buffer circuit, the input signal is passed through the second buffer circuit.

Preferably, the control circuit comprises a secondary comparator for comparing the voltage of the input signal with an intermediate reference voltage, the control circuit being responsive to the secondary comparator for selecting one of the first and second buffer circuits for passing the input signal to the signal processing circuit. Advantageously, the intermediate reference voltage is selected to lie between the lower operating voltage limit of the first buffer circuit and the upper operating voltage limit of the second buffer circuit.

In another embodiment of the invention a primary switching circuit is provided for selectively switching the input signal through the one of the buffer circuit and the bypass circuit, the primary switching circuit being responsive to the control circuit for selecting the one of the buffer circuit and the bypass circuit through which the input signal is to be passed to the signal processing circuit, Preferably, the primary switching circuit comprises a first primary switch located in the buffer circuit for isolating the buffer circuit from the signal processing circuit, and a second primary switch located in the bypass circuit for isolating the bypass circuit from the signal processing circuit, the respective first and second primary switches being responsive to the control circuit such that when one of the first and second primary switches is in a closed circuit state for selecting the corresponding one of the buffer circuit and the bypass circuit, the other of the first and second primary switches is in an open circuit state.

In one embodiment of the invention a secondary switching circuit is provided for selectively passing the input signal through one of the first and second buffer circuits.

In one embodiment of the invention the first and second buffer circuits each comprise an operational amplifier.

In another embodiment of the invention the first and second buffer circuits each have a gain of one.

In another embodiment of the invention each first and second primary switch comprises a primary transmission gate switch, and preferably, each primary transmission gate switch comprises a complementary pair of N-type and P-type primary switches.

In one embodiment of the invention the control circuit is responsive to an externally generated control signal for selecting the one of the buffer circuit and the bypass circuit.

In a further embodiment of the invention the conditioning circuit is implemented as an integrated circuit, and may be implemented as a complementary metal oxide semiconductor circuit.

In a further embodiment of the invention the conditioning circuit is adapted for selectively buffering an input signal to an analog to digital converter.

The invention also provides a circuit comprising:

a signal processing circuit for processing a plurality of input signals, a main switch circuit for selectively switching at least one of the plurality of input signals to the signal processing circuit, and at least one conditioning circuit for selectively buffering the input signals received from the main switch circuit to the signal processing circuit, each conditioning circuit comprising:

a buffer circuit for buffering the input signals, a bypass circuit for bypassing the buffer circuit, and a control circuit for selecting one of the buffer circuit and the bypass circuit for passing the selected input signals to the signal processing circuit, so that the input signals the voltage of which fall outside the operating range of the buffer circuit, are passed to the signal processing circuit through the bypass circuit.

In one embodiment of the invention the signal processing circuit comprises two input terminals for receiving positive signals of the selected input signals and negative signals of the selected input signals from the main switch circuit, and the conditioning circuit is located for passing the positive or negative signals of the selected input signals from the main switch circuit to one of the input terminals of the signal processing circuit.

In another embodiment of the invention one of the input terminals of the signal processing circuit is a positive input terminal, and the other input terminal of the signal processing circuit is a negative input terminal, and two conditioning circuits are provided, one conditioning circuit being located for passing either the positive or negative signals of the selected input signals from the main switch circuit to the positive input terminal of the signal processing circuit, and the other conditioning circuit being located for passing the others of the positive and negative signals of the selected input signals from the main switch circuit to the negative input terminal of the signal processing circuit.

In a further embodiment of the invention the main switch circuit is operable for alternately applying the positive and negative signals of the selected input signals to each of the positive and negative input terminals of the signal processing circuit.

In one embodiment of the invention the main switch circuit is responsive to a select signal for selecting the input signals, and the control circuit of each conditioning circuit is responsive to the select signal for selecting the one of the buffer circuit and the bypass circuit.

In another embodiment of the invention the control circuit of each conditioning circuit is responsive to the voltage of the selected input signal received by the conditioning circuit for selecting the one of the buffer circuit and the bypass circuit In one embodiment of the invention the control circuit of each conditioning circuit comprises a primary comparing circuit for comparing the voltage of the input signal received by the conditioning circuit with a reference voltage for determining if the voltage of the input signal is within the operating voltage range of the buffer circuit, and the control circuit is responsive to the primary comparing circuit for selecting the one of the buffer circuit and the bypass circuit. Preferably, the primary comparing circuit of each conditioning circuit comprises a first primary comparator for comparing the voltage of the input signal received by the conditioning circuit with a first reference voltage for determining if the voltage of the input signal exceeds an upper operating voltage limit of the operating voltage range of the buffer circuit, and a second primary comparator for comparing the voltage of the input signal with a second reference voltage for determining if the voltage of the input signal is below a lower operating voltage limit of the operating voltage range of the buffer circuit, the first reference voltage being higher than the second reference voltage.

Ideally, the buffer circuit of each conditioning circuit comprises a first buffer circuit and a second buffer circuit connected in parallel, the first and second buffer circuits having respective overlapping operating voltage ranges, the operating voltage range of the first buffer circuit having an upper operating voltage limit higher than the upper operating voltage limit of the second buffer circuit, and the operating voltage range of the second buffer circuit having a lower operating voltage limit lower than the lower operating voltage limit of the first buffer circuit, the respective first and second buffer circuits being alternately selectable so that if the voltage of the input signal exceeds the upper operating voltage limit of the second buffer circuit, the input signal is passed through the first buffer circuit, and if the voltage of the input signal falls below the lower operating voltage limit of the first buffer circuit, the input signal is passed through the second buffer circuit.

In one embodiment of the invention the control circuit of each conditioning circuit comprises a secondary comparator for comparing the voltage of the input signal received by the conditioning circuit with an intermediate reference voltage, the control circuit being responsive to the secondary comparator for selecting one of the first and second buffer circuits for passing the input signal to the signal processing circuit.

In another embodiment of the invention each conditioning circuit comprises a primary switching circuit for selectively switching each input signal received by the conditioning circuit through the one of the buffer circuit and the bypass circuit, the primary switching circuit being responsive to the control circuit for selecting the one of the buffer circuit and the bypass circuit through which the input signal is to be passed to the signal processing circuit.

In a further embodiment of the invention each conditioning circuit comprises a secondary switching circuit for selectively passing the input signal received by the conditioning circuit through one of the first and second buffer circuits.

In one embodiment of the invention the signal processing circuit is an analog to digital converter.

In another embodiment of the invention the signal processing circuit is adapted for processing differential input signals and pseudo-differential input signals.

In another embodiment of the invention the analog to digital converter is a chopped analog to digital converter, and the main switch circuit is responsive to a chop signal outputted by the analog to digital converter for switching respective positive and negative signals of the selected ones of the input signals alternately to the positive and negative input terminals of the analog to digital converter, the control circuit being responsive to the chop signal for selecting the one of the buffer circuit and the conditioning circuit.

In a further embodiment of the invention the circuit is implemented as an integrated circuit.

Further the invention provides an analog to digital converter circuit comprising:

an analog to digital converter for converting a plurality of analog input signals to digital signals, a main switch circuit for selectively switching at least one of the plurality of analog input signals to the analog to digital converter, and at least one conditioning circuit for receiving and selectively buffering the input signals received from the main switch circuit to the analog to digital converter, each conditioning circuit comprising:

a buffer circuit for buffering the input signals, a bypass circuit for bypassing the buffer circuit, and a control circuit for selecting one of the buffer circuit and the bypass circuit for passing the selected input signals to the analog to digital converter, so that the input signals, the voltage of which fall outside the operating range of the buffer circuit, are passed to the analog to digital converter through the bypass circuit.

In one embodiment of the invention in a sampling phase of a conversion cycle of the analog to digital converter an input capacitor is charged in response to a coarse phase signal and a fine phase signal, and the control circuit is responsive to the coarse phase signal so that the buffer circuit of each conditioning circuit is always selected during the coarse charging phase of the input capacitor of the analog to digital converter.

In another embodiment of the invention a primary switching circuit is provided for selectively switching the input signals through the one of the buffer circuit and the bypass circuit of each conditioning circuit, the primary switching circuit being responsive to the control circuit for selecting the one of the buffer circuit and the bypass circuit through which the input signal is to be passed to the analog to digital converter.

In a further embodiment of the invention the primary switching circuit is implemented by switches of the analog to digital converter.

The invention also provides a method for buffering an input signal to a signal processing circuit, the method comprising the steps of:

providing a buffer circuit for buffering the input signal to the conditioning circuit, providing a bypass circuit for bypassing the buffer circuit, and selecting one of the buffer circuit and the bypass circuit for passing the input signal to the signal processing circuit so that the input signal is applied to the signal processing circuit through the bypass circuit when the voltage of the input signal falls outside the operating voltage range of the buffer circuit.

ADVANTAGES OF THE INVENTION

The advantages of the invention are many. A particularly important advantage of the invention is that the conditioning circuit according to the invention provides a relatively simple non-complex circuit for selectively buffering signals to a signal processing circuit, such that only those input signals the voltage of which is within the operating range of the buffer circuit are buffered. Input signals which fall outside the operating range of the buffer circuit are not buffered, and are passed directly to the signal processing circuit. By virtue of the fact that the control circuit is responsive to the input signals, the appropriate one of the buffer circuit and the bypass circuit is selected automatically without the need for any human intervention.

The invention and its advantages will be more clearly understood from the following description of some preferred embodiments thereof which are given by way of example only with reference to the accompanying drawings.

DETAILED DESCRIPTION OF PREFERRED EMBODIMENTS OF THE INVENTION

Figure 1:
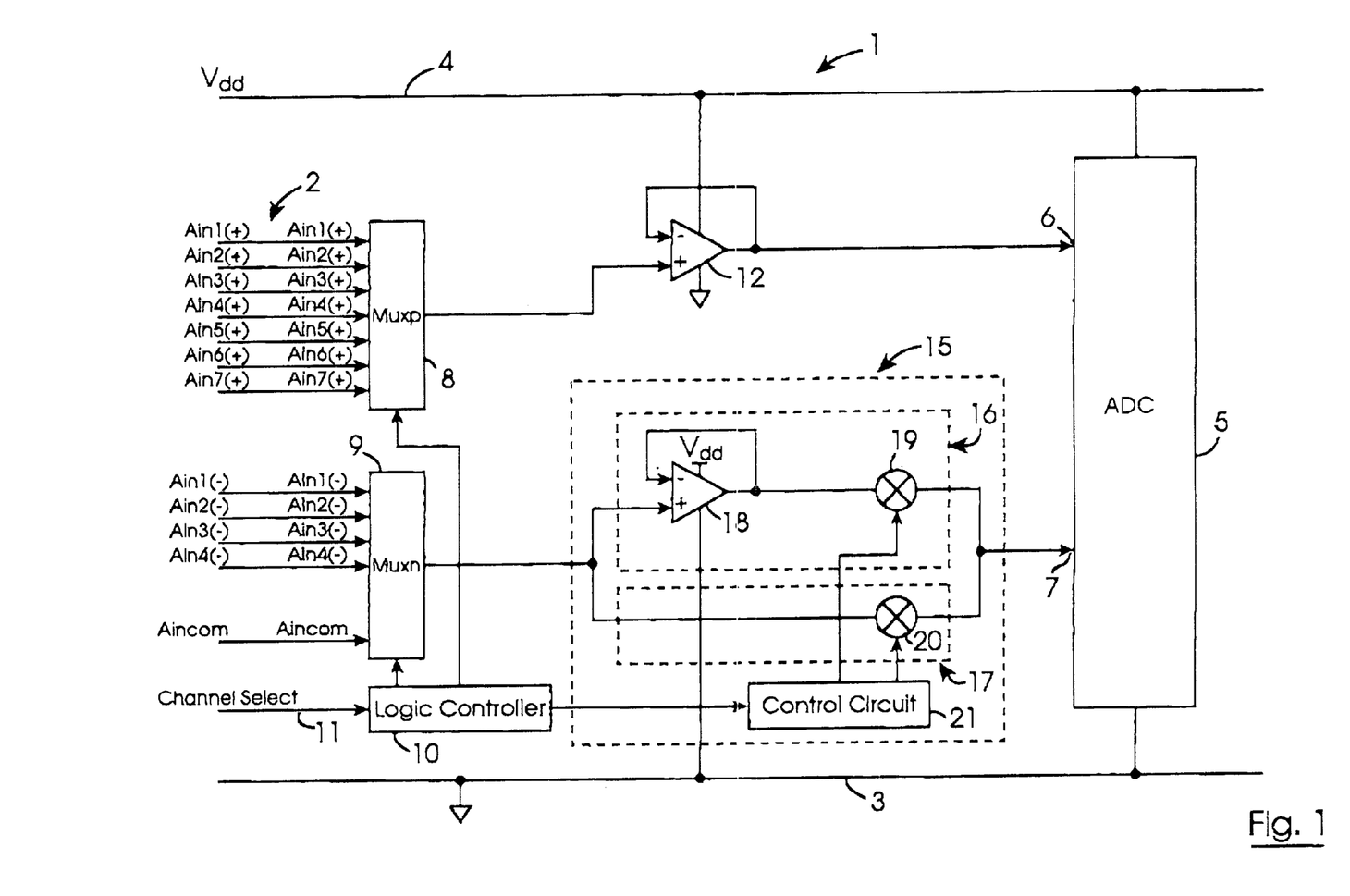
FIG. 1 is a block representation of a signal processing circuit according to the invention.

Referring to the drawings and initially to FIG. 1, there is illustrated an analog to digital converter (ADC) circuit according to the invention indicated generally by the reference numeral 1 for converting analog input signals on input terminals 2 to digital signals. Twelve input terminals 2 are provided and are identified as the terminals Ain1(+) through Ain7(+) and Ain1(−) through Ain4(−) and Aincom for receiving the input signals as will be described below. The ADC circuit 1 is implemented as an integrated circuit in CMOS, and is powered between a negative rail, namely, a ground rail 3 and a positive rail 4 which is held at a supply voltage $V_{DD}$.

The ADC circuit 1 comprises an analog-to-digital converter (ADC) 5 in which selected ones of the analog input signals on the input terminals 2 are sequentially converted to digital form. In this embodiment of the invention the ADC 5 is a sigma-delta ADC, and comprises a positive input terminal 6 and a negative input terminal 7 for receiving positive and negative analog signals, respectively. A main switch circuit for selectively and sequentially switching the input signals on the input terminals 2 to the ADC 5 comprises a first multiplexor 8 for receiving positive ones of the input signals on the input terminals Ain1(+) through Ain7(+), and a second multiplexor 9 for receiving negative ones of the input signals on the channels Ain1(−) through Ain4(−) and Aincom. The input signals are sequentially selected in a predetermined sequence by the first and second multiplexors 8 and 9 under the control of a logic controller 10 in response to a channel select signal received on channel select input 11, and are passed to the positive and negative input terminals 6 and 7, respectively, of the ADC 5.

In this embodiment of the invention the ADC circuit 1 is configured to receive four differential analog input signals and three pseudo-differential analog input signals, The pseudo-differential input signals have a common negative input signal which is applied to the input terminal Aincom, which can be at or close to the voltage of the ground rail 3. The differential and pseudo-differential input signals may be from any sources, for example, temperature sensors, pressure sensors and the like. The ADC circuit 1 is configured to receive one of the differential input signals on the input terminals Ain1(+)and Ain1(−). The other three differential input signals are received on the input terminals Ain2(+) and Ain2(−), Ain3(+) and Ain3(−), and Ain4(+) and Ain4(−). The positive input signals of the respective differential input signals are applied to the input terminals Ain1(+) to Ain4(+) and are fed to the first multiplexor 8, while the negative input signals of the differential input signals are applied to the input terminals Ain1(−) to Ain4(−) and are fed to the second multiplexor 9. The common negative input signal of the pseudo-differential input signals is applied to the input terminal Aincom and is fed to the second multiplexor 9, while the positive input signals of the pseudo-differential input signals are applied to the input terminals Ain5(+), Ain6(+) and Ain7(+) and are fed to the first multipelxor 8.

The positive input signals are buffered and passed from the first multiplexor 8 to the positive input terminal 6 of the ADC 5 through a conventional buffer 12 whose gain is one and operating voltage range is such as to be sufficient for buffering all the positive input signals received on the input terminals Ain1(+) through Ain7(+). The power supply for the buffer 12 is derived from the positive and ground rails 4 and 3, respectively. The negative input signals are passed from the second multiplexor 9 to the ADC 5 through a conditioning circuit 15 according to the invention.

The conditioning circuit 15 comprises a buffer circuit 16 and a bypass circuit 17, through one of which the negative input signals are selectively passed to the negative input terminal 7 of the ADC 5. The buffer circuit 16 comprises a buffer 18 which is provided by an operational amplifier configured as a high impedance buffer for selectively buffering the negative input signals. The buffer 18 has a gain of one and an operating voltage range such that the negative voltages of some of the input signals may fall outside the operating voltage range of the buffer 18, and thus the buffer 18 would be unsuitable for buffering such signals without introducing distortion and noise into the input signals. The power supply for the buffer 18 is derived from the positive and ground rails 4 and 3, respectively. The bypass circuit 17 bypasses the buffer circuit 16, and selectively passes those of the negative input signals whose voltage falls outside the operating voltage of the buffer 18 directly to the negative input terminal 7 of the ADC 5, as will be described below.

A primary switching circuit comprising a first primary switch 19 in the buffer circuit 16, and a second primary switch 20 in the bypass circuit 17, selectively switches each negative input signal from the second multiplexor 9 through one of the buffer circuit 16 and the bypass circuit 17 to the negative input terminal 7 of the ADC 5 in response to primary switching signals from a control circuit 21 as will be described below. Each of the first and second primary switches 19 and 20 is implemented as a transmission gate switch comprising a complementary pair of N-type and P-type switches. The first primary switch 19 is located in the buffer circuit 16 between the buffer 18 and the ADC 5 for selectively isolating the ADC 5 from the buffer circuit 16. The second primary switch 20 is located in the bypass circuit 17 and selectively isolates the ADC 5 from the bypass circuit 17.

The control circuit 21 outputs respective primary switching signals to the first and second primary switches 19 and 20, so that when one of the first and second primary switches 19 and 20 is selected in the closed circuit state for selecting the corresponding one of the buffer circuit 16 and the bypass circuit 17, the other of the first and second primary switches 19 and 20 is operated in the open circuit state for isolating the corresponding one of the buffer circuit 16 and the bypass circuit 17 from the ADC 5. The control circuit 21 is responsive to the logic controller 10 for outputting the primary switching signals in response to the channel select signal on the channel select input 11. Accordingly, the one of the buffer circuit 16 and the bypass circuit 17 which is selected is selected in response to the channel select signal which also selects the channel of the second multiplexor 9. Thus, in this embodiment of the invention when an input signal which is known in advance to be of voltage which would fall outside the operating voltage range of the buffer 18 is selected by the channel select signal, the control circuit 21, in response to a signal from the logic controller 10, which indicates the selected channel of the second multiplexor 9 outputs the appropriate primary switching signals to the first and second primary switches 19 and 20 for selecting the bypass circuit 17 for passing the input signal from the second multiplexor 9 directly to the negative input terminal 7 of the ADC 5. Otherwise, the control circuit 21 outputs appropriate primary switching signals to the first and second primary switches 19 and 20 for selecting the buffer circuit 16 for buffering and passing the input signals selected by the channel select signal to the negative input terminal 7 of the ADC 5.

In this embodiment of the invention the common negative signal of the pseudo-differential input signals, on the input terminal Aincom is known to be of voltage which falls outside the operating voltage range of the buffer 18, The voltage of the common negative signal is at or close to the voltage of the ground rail 3 which powers the buffer 18, and even when above the ground rail 3, the voltage of the common negative signal is insufficiently above the voltage of the ground rail 3 to be above the lower operating voltage limit of the buffer 18. However, the negative input signals of the differential input signals, which are positive with respect to the ground rail 3, are of such voltages as to be within the operating voltage range of the buffer 18. Accordingly, when the channel of the second multiplexor 9 corresponding to the input terminal Aincom is selected by the logic controller 10 in response to the channel select signal, the control circuit 21 outputs primary switching signals to the first and second primary switches 19 and 20, such that the first primary switch 19 is in the open circuit state and the second primary switch 20 is in the closed circuit state, thereby operating the conditioning circuit 15 with the bypass circuit 17 selected, so that the common negative input signal of each selected pseudo-differential input signal is passed through the bypass circuit 17 to the negative input terminal 7 of the ADC 5. For all other channel select signals the control circuit 21 operates the first and second primary switches 19 and 20 such that the first primary switch 19 is in the closed circuit state and the second primary switch 20 is in the open circuit state, so that the buffer circuit 16 is selected and the negative input signals of the differential input signals are buffered and passed through the buffer 18 to the negative input terminal 7 of the ADC 5.

In use, the positive input signals of the differential and pseudo-differential input signals are buffered through the buffer 12 in conventional fashion. For so long as the channel of the second multiplexor 9 which corresponds to the input terminal Aincom remains unselected by the channel select signal, the first and second primary switches 19 and 20 of the conditioning circuit 15 are operated by the control circuit 21 so that the buffer circuit 16 is selected and the negative input signals of the differential input signals are buffered through the buffer circuit 16 to the ADC 5. On the channel of the second multiplexor 9 which corresponds to the terminal Aincom being selected, the control circuit 21 in response to the signal from the logic controller 10, derived from the channel select signal operates the first and second primary switches 19 and 20, so that the bypass circuit 17 is selected and the common negative input signal of the pseudo-differential input signal is applied directly to the negative input terminal 7 of the ADC 5 through the bypass circuit 17.

Figure 2:
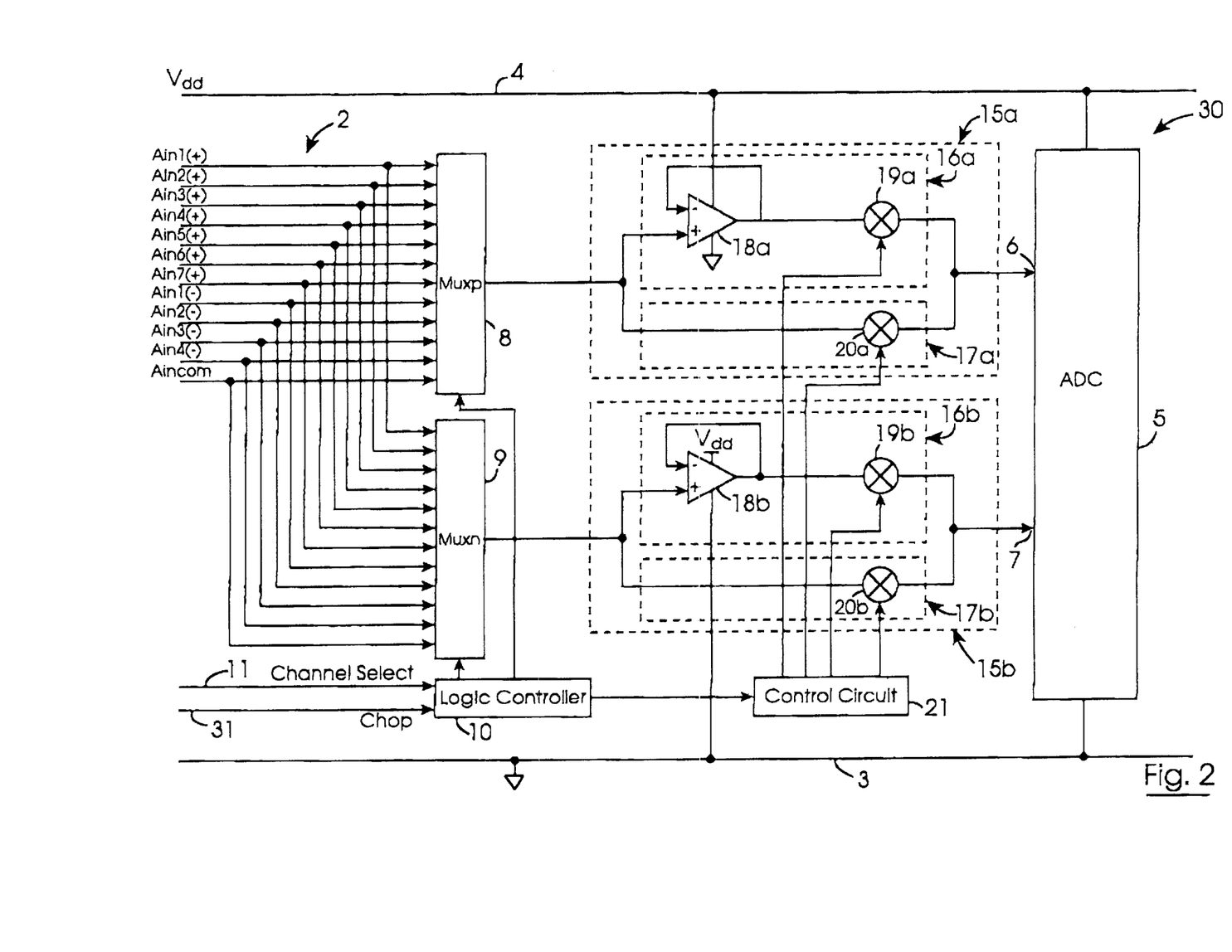
FIG. 2 is a block representation of a signal processing circuit according to another embodiment of the invention.

Referring now to FIG. 2 there is illustrated an ADC circuit according to another embodiment of the invention indicated generally by the reference numeral 30. The ADC circuit 30 is somewhat similar to the ADC circuit 1 and similar components are identified by the same reference numerals. In this embodiment of the invention the ADC circuit 30 operates with a low offset voltage and is of the type disclosed in U.S. Pat. No. 5,675,334 of McCartney which is referred to as a chopped ADC circuit, Thus, in the ADC circuit 30 according to this embodiment of the invention the positive input signals are alternately multiplexed through the first and second multiplexors 8 and 9, and similarly, the negative input signals are likewise alternately multiplexed through the first and second multiplexors 8 and 9. The ADC circuit 30 is configured similarly to the ADC circuit 1 for converting four differential analog input signals and three pseudo-differential input signals to digital form. Two conditioning circuits 15a and 15b according to the invention are provided for applying the input signals from the first and second multiplexors 8 and 9, respectively, to the positive input terminal 6 and the negative input terminal 7, respectively of the ADC 5, The conditioning circuits 15a and 15b are similar to each other and are similar to the conditioning circuit 15 of the ADC circuit 1.

In this embodiment of the invention the logic controller 10 is responsive to the channel select signal on the channel select input 11 for sequentially selecting the input signals on the input terminals to be switched to the ADC 5, and the logic controller 10 is also responsive to a chop signal received on a chop signal input 31, which determines the time periods during which the selected positive and negative input signals are alternately switched by the first and second multiplexors 8 and 9 to the respective positive and negative input terminals 6 and 7 of the ADC 5. The chop signal is a single bit logic signal, and when at logic zero the selected positive input signal is passed through the first multiplexor B and the conditioning circuit 15a to the positive input terminal 6 of the ADC 5, and the selected negative input signal is passed through the second multiplexor 9 and the conditioning circuit 15b to the negative input terminal 7 of the ADC 5. When the chop signal is at logic one the selected positive and negative input signals are reversed on the positive and negative input terminals 6 and 7 of the ADC 5, so that the selected negative input signal is applied to the positive input terminal 6 of the ADC 5 through the first multiplexor 8 and the conditioning circuit 15a, and the selected positive input signal is applied to the negative input terminal 7 of the ADC 5 through the second multiplexor 9 and the conditioning circuit 15b.

In this embodiment of the invention the positive and negative input signals of the differential signals are of voltages as to be within the operating voltage ranges of the buffers 18a and 18b of the respective buffer circuits of 16a and 16b. The positive input signals of the pseudo-differential signals are of voltages as to be within the operating voltage ranges of the buffers 18a and 18b of the respective buffer circuits 16a and 16b. However, the common negative input signal of the pseudo-differential signals on the input terminal Aincom is outside the operating voltage ranges of the buffers 18a and 18b of the respective buffer circuits 16a and 16b.

In use, when the differential input signals are being multiplexed through the first and second multiplexors 8 and 9, irrespective of the status of the chop signal, the first and second primary switches 19 and 20 are operated under the control of the control circuit 21 so that the positive and negative input signals are buffered through the corresponding buffer circuits 16a and 16b of the conditioning circuits 15a and 15b to the ADC 5. When a pseudo-differential input signal is being multiplexed through the first and second multiplexors 8 and 9, and when the chop signal is at logic zero, the positive input signal is multiplexed through the first multiplexor 8 and the common negative input signal on the terminal Aincom is multiplexed through the second multiplexor 9. In this case the control circuit 21 in response to signals from the logic controller 10 derived from the channel select signal and the chop signal operates the first and second primary switches 19a and 20a of the conditioning circuit 15a for selecting the buffer circuit 16a so that the positive input signal is buffered through the buffer circuit 16a to the positive input terminal 8 of the ADC 5. However, the control circuit 21 operates the first and second primary switches 19b and 20b in the conditioning circuit 15b for selecting the bypass circuit 17b, so that the common negative input signal is passed through the bypass circuit 17b to the negative input terminal 7 of the ADC 5.

When the status of the chop signal changes to logic one, the common negative input signal of the pseudo-differential input signal is multiplexed through the first multiplexor 8 and the positive input signal is multiplexed through the second multiplexor 9, the conditioning circuit 15a and 15b are operated in the reverse. In other words, the first and second primary switches 19e and 20a of the respective conditioning circuits 15a and 15b are operated under the control of the control circuit 21 so that the bypass circuit 17a is selected in the conditioning circuit 15a, and the buffer circuit 16b is selected in the conditioning circuit 15b. In this way the common negative of the input signal on the input terminal Aincom is applied directly through the bypass circuit 17a of the conditioning circuit 15a to the positive input terminal 6 to the ADC 5, and the positive input signal is applied through the buffer circuit 16b of the conditioning circuit 15b to the negative input terminal 7 of the ADC 5.

Otherwise the ADC circuit 30 and its operation is similar to the ADC circuit 1.

Figure 3:
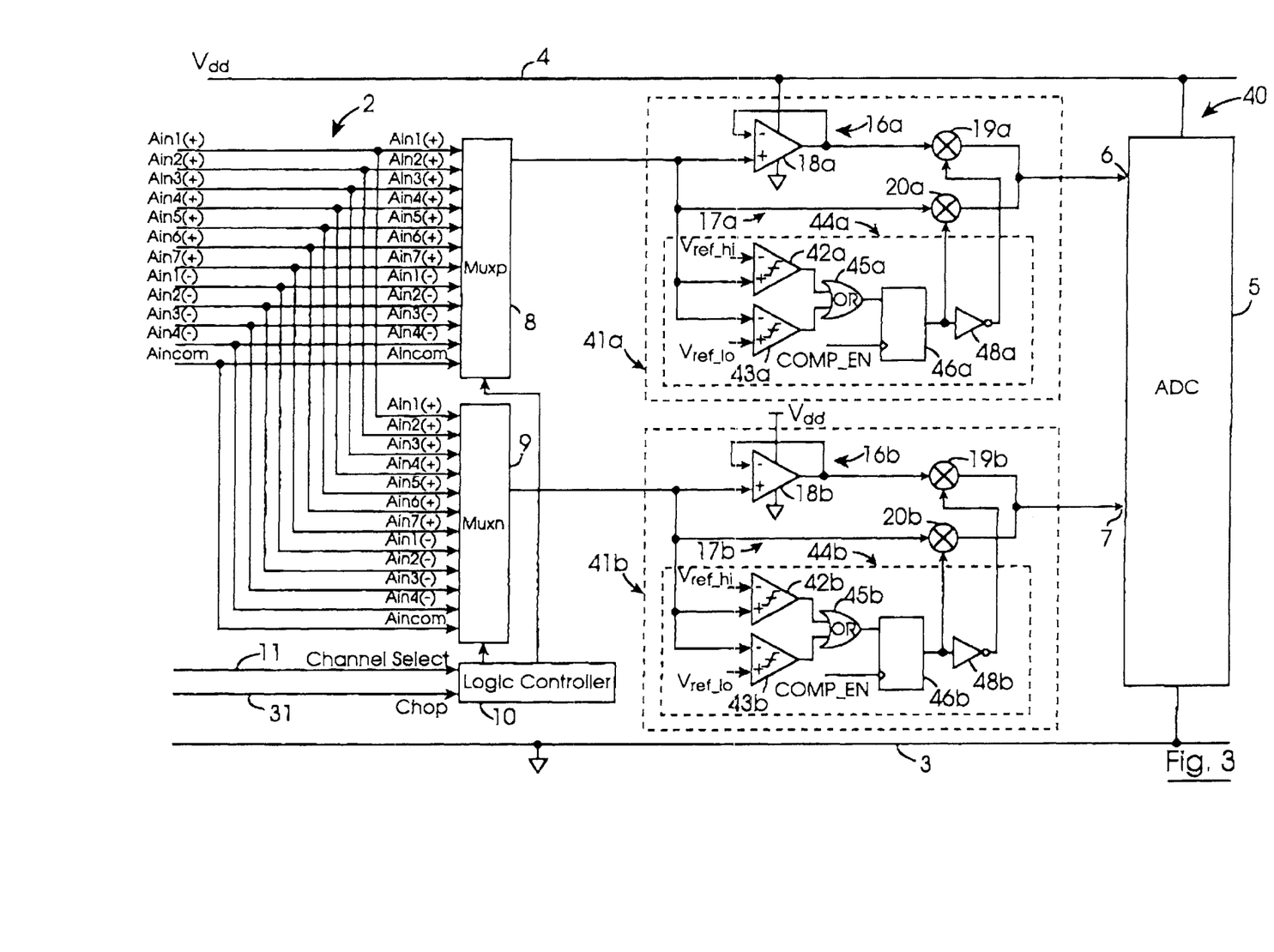
FIG. 3 is a block representation of a signal processing circuit according to a further embodiment of the invention.

Referring now to FIG. 3 there is illustrated an ADC circuit 40 according to another embodiment of the invention. The ADC circuit 40 is somewhat similar to the ADC circuit 1 and similar components are identified by the same reference numerals. In this embodiment of the invention the ADC circuit 40 is a chopped ADC circuit of the type disclosed in U.S. Pat. No. 5,675,334 of McCartney, and the selected positive and negative input signals are alternately multiplexed through the first and second multiplexors 8 and 9 as already described with reference to the ADC circuit 30, The ADC circuit 40 is provided with two conditioning circuits 41a and 41b also according to the invention. However, in this embodiment of the invention each conditioning circuit 41 is provided with a control circuit 44 which is responsive to the voltage of the input signal applied to the corresponding conditioning circuit 41 for selecting one of the buffer circuit 16 and the bypass circuit 17 of the corresponding conditioning circuit 41.

Each control circuit 44 comprises a primary comparing circuit, which comprises a first primary comparator 42 and a second primary comparator 43 for determining if the voltage of the input signal applied to the corresponding conditioning circuit 41 is within the operating voltage range of the buffer 18 of the corresponding buffer circuit 16. The first primary comparator 42 compares the voltage of the input signal applied to the conditioning circuit 41 with a first reference voltage, namely, a high reference voltage $V_{ref\_hi}$ which corresponds to the upper operating voltage limit of the corresponding buffer 18 to ascertain if the voltage of the input signal is below the upper operating voltage limit of the buffer 18. The second primary comparator 43 compares the voltage of the input signal applied to the conditioning circuit 41 with a second reference voltage, namely, a low reference voltage $V_{ref\_lo}$ which corresponds to the lower operating voltage limit of the corresponding buffer 18 to ascertain if the voltage of the input signal is above the lower operating voltage limit of the buffer.

For so long as the voltage of the input signals received applied to each conditioning circuit 41 remains within the operating voltage range of the corresponding buffer 18 the respective first and second primary comparators 42 and 43 output logic low signals. However, on the voltage of the input signal falling outside the operating voltage range of the corresponding buffer 18, the one of the first and second primary comparators 42 and 43 in which the voltage of the input signal exceed the high voltage reference, or falls below the low voltage reference outputs a logic high. The outputs of the respective first and second primary comparators 42 and 43 are OR'd in an OR gate 45, and on either one of the first and second primary comparators 42 and 43 outputting a logic high, the corresponding OR gate 45 similarly outputs a logic high which is latched in a primary latch 46 to form the primary switching signal which is outputted directly to the corresponding second primary switch 20. An inverter 48 inverts the primary switching signal which is applied to the corresponding first primary switch 19.

A logic low from the primary latch 46 which is inverted in the inverter 48 holds the first primary switch 19 in the closed circuit state, and the logic low holds the second primary switch 20 in the open circuit state. In this way the input signals received by each conditioning circuit 41 which fall within the operating voltage range of the corresponding buffer 18 are passed through the corresponding buffer circuit 16 to the corresponding input terminals 6 or 7 of the ADC 5, and are buffered by the buffer 18. A logic high signal latched by the primary latch 46 operates the first and second primary switches 19 and 20 in the reverse states, so that an input signal applied to each conditioning circuit 41, the voltage of which falls outside the operating voltage range of the buffer 18 is passed directly through the corresponding bypass circuit 17 to the relevant one of the input terminals 6 or 7 of the ADC 5. The primary latch 46 of each conditioning circuit 41 is strobed by a comparator enable signal, namely, a COMP_EN signal from the ADC circuit 40 so that the output of the corresponding OR gate 45 is latched by the primary latch 46 for a predetermined time period sufficient for passing the input signal through the corresponding conditioning circuit, so that the input signal is applied to the corresponding input terminals 6 or 7 of the ADC 5 for an appropriate period sufficient for sampling by the ADC 5. The COMP_EN signal is a signal generated by the ADC 5 for enabling a comparator within the ADC 5, and will be well known to those skilled in the art Otherwise, the ADC circuit 40 and its operation is similar to that of the ADC circuit 30 already described. However, since the conditioning circuits 41a and 41b are responsive to the voltage of the input signals, the channel select and chop signals are not required as inputs to the control circuits 44a and 44b of the respective conditioning circuits 41a and 41b.

Figure 4:
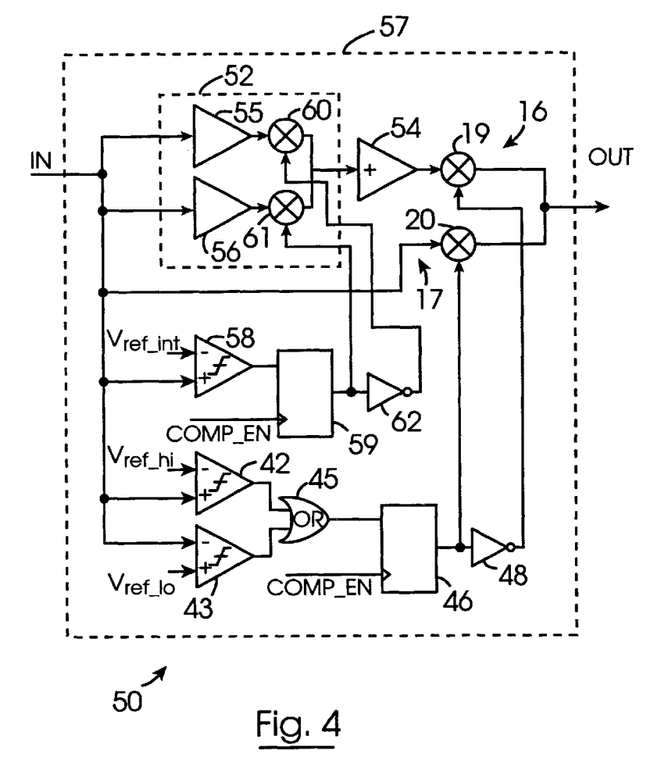
FIG. 4 is a block representation of a conditioning circuit according to the invention for use in a signal processing circuit.

Referring now to FIG. 4 there is illustrated a conditioning circuit 50 also according to the invention for use with an ADC circuit, for example, the ADC circuit 40 described with reference to FIG. 3. The conditioning circuit 50 is substantially similar to the conditioning circuits 41 and similar components are identified by the same reference numerals. The main difference between the conditioning circuit 50 and the conditioning circuit 41 relates to the buffer circuit 16. The buffer circuit 16 comprises an input circuit 52 and a second stage circuit 54. The input circuit 52 of the buffer circuit 16 comprises a first buffer circuit provided by a first buffer 55, and a second buffer circuit provided by a second buffer 56. The first buffer 55 comprises an N-type buffer having an N-type input differential pair, for example, NMOS, and has an operating voltage range with a relatively high upper operating voltage limit. The second buffer comprises a P-type buffer having a P-type input differential pair, for example. PMOS, and has an operating voltage range with a relatively low lower operating voltage limit. The operating voltage ranges of the first and second buffers 55 and 56 overlap. However, the upper operating voltage limit of the first buffer 55 is higher than the upper operating voltage limit of the second buffer 56, and the lower operating voltage limit of the second buffer 56 is lower than the lower operating voltage limit of the first buffer 55. Accordingly, the first buffer 55 is suitable for input signals of higher voltage, while the second buffer 56 is suitable for lower voltage input signals.

The conditioning circuit 50 comprises a control circuit 57, which in addition to first and second primary comparators 42 and 43, which are similar to the first and second primary comparators 42 and 43 of the conditioning circuit 41, also comprises a secondary comparator 58 for comparing the voltage of the input signal applied to the conditioning circuit 50 with an intermediate reference voltage $V_{ref\_int}$. The intermediate reference voltage $V_{ref\_int}$ is typically of value between the lower operating voltage limit of the first buffer 55 and the upper operating voltage limit of the second buffer 56. Thus if the voltage of the input signal applied to the conditioning circuit 50 is above the intermediate reference voltage $V_{ref\_int}$, the first buffer 55 is selected, and the second buffer 56 is selected when the voltage of the applied input signal is below the intermediate reference voltage $V_{ref\_int}$. In practice, it is envisaged that the value of $V_{ref\_int}$ may be selected to be closer to either the lower operating voltage limit of the first buffer 55 or the upper operating voltage limit of the second buffer 56 for minimizing cycling between the respective first and second buffers 55 and 56 during operation.

A secondary latch 59 latches the output of the secondary comparator 58 to a switching circuit which comprises respective first and second secondary switches 60 and 61 for selecting the appropriate one of the first and second buffers 55 and 56. The secondary latch 59 is strobed by the COMP_EN signal as already described with reference to the primary latch 46. The latched output of the secondary comparator 58 is applied directly to the second secondary switch 61, and is applied to the first secondary switch 60 through an inverter 62. In this way when the first secondary switch 60 is selected in a closed circuit state, the second secondary switch 61 is selected in an open circuit state for selecting the first buffer 55, and vice versa for selecting the second buffer 56. The first and second secondary switches 60 and 61 are of similar construction to the first and second primary switches 19 and 20 already described with reference to the conditioning circuit 1 of FIG. 1, Operation of an ADC circuit which would typically comprises a pair of conditioning circuits 50 would be substantially similar to that of the ADC circuit 40 with the exception that as well as selecting the appropriate one of the buffer circuit 16 and the bypass circuit 17 of the respective conditioning circuits 50, the appropriate one of the first and second buffers 55 and 56 is also selected, depending on whether the voltage of the input signal applied to the corresponding one of the conditioning circuits 50 is above or below the intermediate reference voltage $V_{ref\_int}$.

Figure 5:
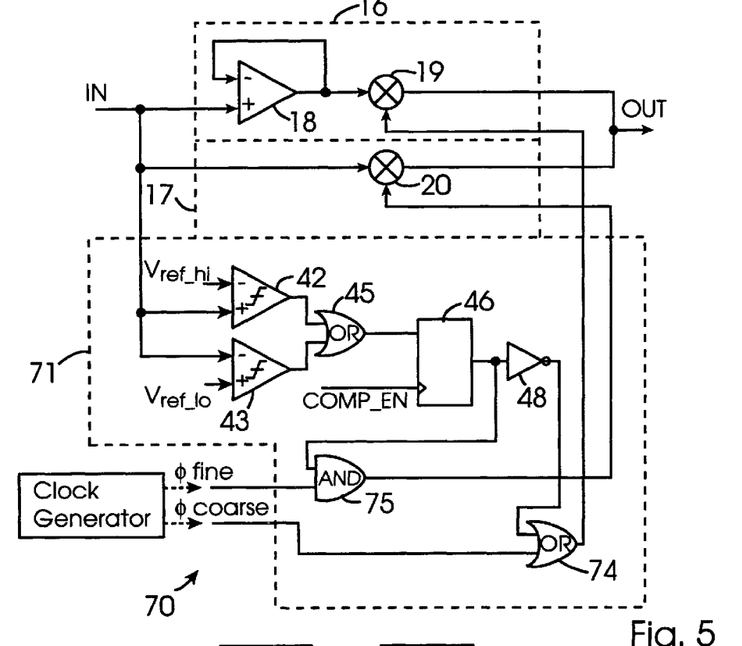
FIG. 5 is a block representation of a conditioning circuit according to another embodiment of the invention also for use in a signal processing circuit.
Figure 6:
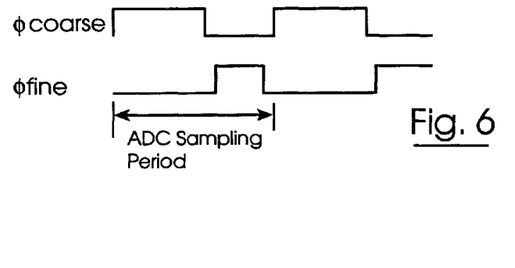
FIG. 6 is a graphical representation of signals associated with the conditioning circuit of FIG. 5.

Referring now to FIGS. 5 and 6 there is illustrated a conditioning circuit 70 also according to the invention which is substantially similar to the conditioning circuit 41 described with reference to FIG. 3, and similar components are identified by the same reference numerals. The conditioning circuit 70 is suitable for use in the ADC circuit 40. In this embodiment of the invention as well as being responsive to the voltage of the input signal applied to the conditioning circuit 70, the conditioning circuit 70 is also responsive to two phase signals, namely, a coarse phase signal, φcoarse and a fine phase signal, φfine, which are generated by a clock generator. 72 which may be located in the ADC 5 or elsewhere for selecting coarse and fine charging phases of a sampling period during which input capacitors (not shown) of a switched capacitor circuit (also not shown) at the input stage of the ADC 5 are being charged. Initial charging of the input capacitors of the switched capacitor circuit (not shown) is carried out during the coarse phases of the sampling periods, while final charging of the input capacitors of the switched capacitor circuit is carried out during the fine phases of the sampling periods. Such a method for charging a switched capacitor circuit during sampling periods of an ADC is described in an Application Note AN30 entitled "Switched-Capacitor A/D Converter Input Structure" by Jerome Johnston, published by Crystal Semiconductor Corporation of Texas. In the method of Johnston the input signals are buffered to the ADC during the coarse phases, and are passed directly to the ADC unbuffered during the fine phases of the respective sampling periods.

A control circuit 71 of the conditioning circuit 70 is responsive to the coarse and fine phase signals φcoarse and φfine so that irrespective of whether the voltage of the input signal is within or outside the operating voltage range of the buffer 18, the buffer circuit 16 is always selected during the coarse phases for buffering the input signal to the switched capacitor circuit. Where the voltage of the input signal falls outside the operating voltage range of the buffer 18, the bypass circuit 17 is selected only during the fine phases for applying the input signal directly to the switched capacitor circuit, thereby minimizing the current drawn by the ADC circuit while at the same time ensuring that the input capacitors of the switched capacitor circuit of the ADC is charged to a voltage corresponding to that of the input signal. However, once the voltage of the input signal falls within the operating range of the buffer 18, the buffer circuit 16 is selected for both the coarse phase and the fine phase. The coarse and fine phase signals φcoarse and φfine are non-overlapping signals, and typically, the duration of the coarse phase of the sampling period is approximately two-thirds of the sampling period, and the duration of the fine phase is approximately the remaining one-third of the sampling period, see FIG. 6.

An OR gate 74 ORs the output from the inverter 48 with the coarse phase signal, φcoarse The first primary switch 19 in the buffer circuit 16 is operated under the control of the output of the OR gate 74. An AND gate 75 ANDs the fine phase signal φfine with the latched signal from the primary latch 46, and the output from the AND gate 75 controls the second primary switch 20, Thus, when the input signal applied to the conditioning circuit 70 falls within the operating voltage range of the buffer 18, the first and secondary primary switches 19 and 20 are operated for selecting the buffer circuit 16 for buffering the input signal through the buffer circuit 16 to the switched capacitor circuit of the ADC during both the coarse and fine phases of the sampling period. However, when the input signal applied to the conditioning circuit 70 falls outside the operating voltage range of the buffer 18, the first and second primary switches 19 and 20 are operated for selecting the buffer circuit 16 during the coarse phase of the sampling period for buffering the input signal through the buffer circuit 16 to the switched capacitor circuit of the ADC. However, during the fine phase the first and second primary switches 19 and 20 are operated for selecting the bypass circuit 17 for applying the input signal during the fine phase of the sampling period to the switched capacitor circuit of the ADC.

It is envisaged that the buffer circuit 16 of the conditioning circuit 70 could be replaced by the buffer circuit 16 of the conditioning circuit 50 having an input stage 52 and a second stage circuit 54 similar to the input stage 52 and the second stage circuit 54 of the conditioning circuit 50, in which case the control circuit 71 of the conditioning circuit 70 would also incorporate a secondary comparator 58, a secondary latch 59, first and second secondary switches 60 and 61, and an inverter 62 for selecting the first and second buffers 55 and 56.

Figures 7, 8:
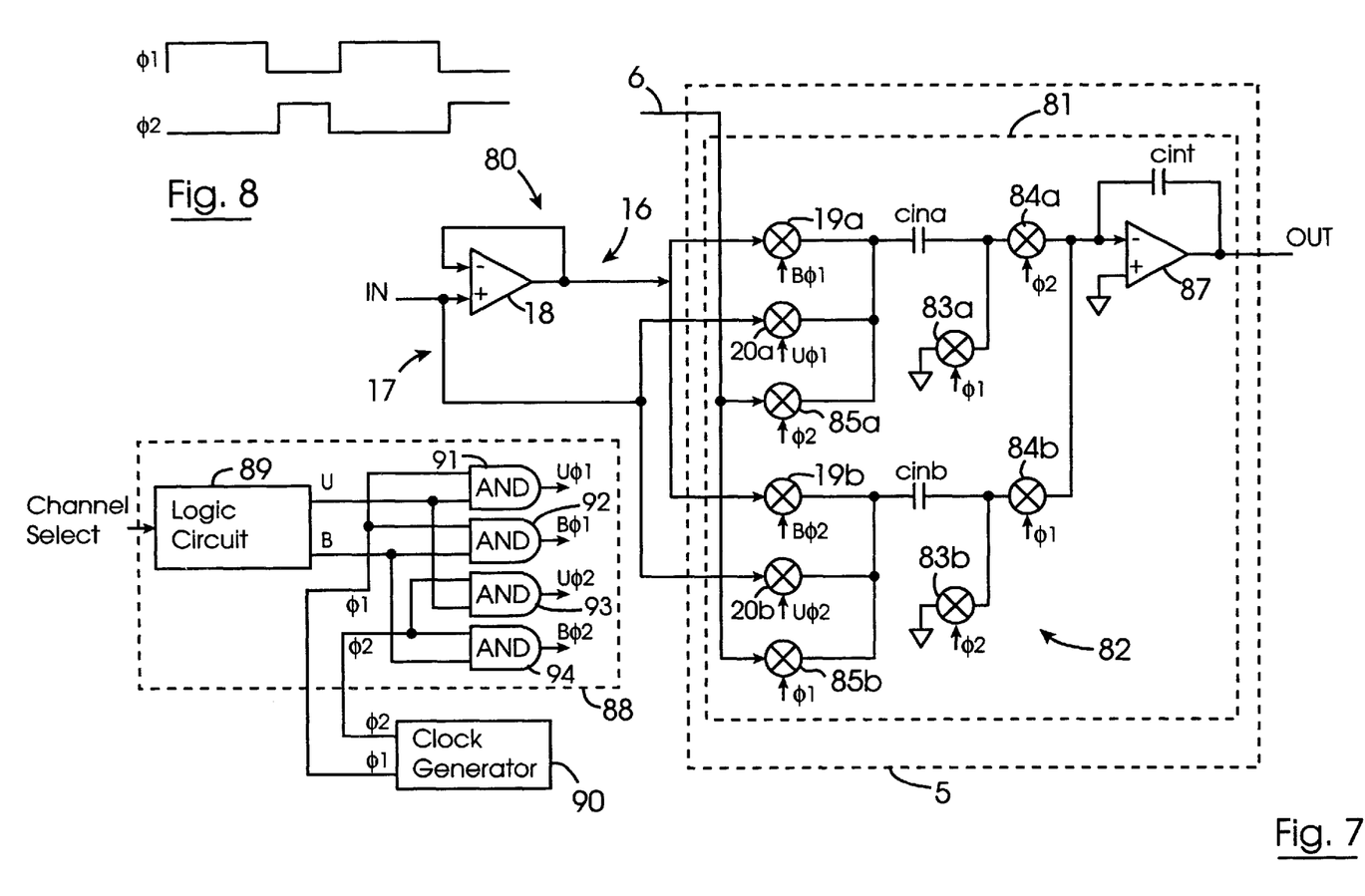
FIG. 7 is a block representation of a conditioning circuit according to a further embodiment of the invention for use in a signal processing circuit.
FIG. 8 is a graphical representation of signals associated with the conditioning circuit of FIG. 7.

Referring now to FIGS. 7 and 8 there is illustrated a conditioning circuit also according to the invention indicated generally by the reference numeral 80 which is suitable for use in the ADC circuit 1 described with reference to FIG. 1, and in this embodiment of the invention the conditioning circuit 80 is particularly suitable for use with a sigma-delta ADC. When used in conjunction with the ADC circuit 1, the conditioning circuit 80 would replace the conditioning circuit 15 at the negative input terminal 7 of the ADC 5. The main difference between the conditioning circuit 80 and the conditioning circuits 15 is that the first and second primary switches 19 and 20 of the conditioning circuit 80 are formed by switches 19a, and 19b, and 20a and 20b, which also form sampling switches of an input stage 82 of a switched capacitor integrator 81 at the positive and negative inputs of the ADC 5.

Before describing the conditioning circuit 80 in detail, the input stage 82 of the switched capacitor integrator circuit 81 will first be described. The input stage 82 comprises first and second input capacitors $C_{ina}$ and $C_{inb}$, respectively, and an integrating amplifier 87 with an integrating capacitor $C_{int}$. Switches 83a, 84a, 83b and 84b are provided on the integrating amplifier side of the first and second input capacitors $C_{ina}$ and $C_{inb}$, respectively, for facilitating alternate charging of the first and second input capacitors $C_{ina}$ and $C_{inb}$ and transferring the charges on the first and second input capacitors $C_{ina}$ and $C_{inb}$ to the integrating capacitor $C_{int}$ during first and second phases of an operating cycle of the integrator circuit 81, in response to first phase and second phase select signals φ1 and φ2, respectively. The first and second phase signals φ1 and φ2 are non-overlapping signals, see FIG. 8, and are normally generated in the ADC circuit 5. The four switches 19a and 19b, 20a and 20b which act as sampling switches for the first and second input capacitors $C_{ina}$ and $C_{inb}$ are provided on the conditioning circuit side of the first and second input capacitors $C_{ina}$ and $C_{inb}$ for charging the first and second input capacitors $C_{ina}$ and $C_{inb}$ from the input signal applied to the conditioning circuit 80 during the operating cycle of the integrator circuit 81. One of the switches 19a or 20a is selected for charging of the first input capacitor $C_{ina}$ during the first phase of the operating cycle, depending on whether the input signal is to be buffered or unbuffered to the first input capacitor $C_{ina}$, in other words, whether the input signal is to be passed through the buffer circuit 16 or the bypass circuit 17. One of the switches 19b or 20b is similarly selected for charging the second input capacitor $C_{inb}$ during the second phase of the operating cycle. Switches 85a and 85b on the conditioning circuit side of the first and second input capacitors $C_{ina}$ and $C_{inb}$ connect the first and second input capacitors $C_{ina}$ and $C_{inb}$ to the positive input terminal 6 of the ADC 5 during transfer of the charge of the respective first and second input capacitors $C_{ina}$ and $C_{inb}$ to the integrating capacitor $C_{int}$.

In this embodiment of the invention the conditioning circuit 80 comprises a control circuit 88 which comprises a logic circuit 89 similar to the control circuit 21 of the ADC circuit 1. The logic circuit 89 outputs a buffer select signal B for selecting the buffer circuit 16, and a bypass select signal U for selecting the bypass circuit 17 in response to the channel select signal. The phase signals φ1 and φ2 from a clock signal generator 90 which would in general, form part of the ADC circuit for selecting the respective first and second phases of the operating cycle of the integrator circuit 81 are received by the control circuit 88. Four AND gates 91 to 94 are provided for appropriately ANDing the first and second phase signals φ1 and φ2 with the buffer and bypass select signals B and U for selecting the appropriate switches 19a, 19b, 20a, 20b. The AND gate 91 ANDs the first phase signal φ1 with the bypass select signal U. The AND gate 92 ANDs the first phase signal φ1 with the buffer select signal B. The AND gates 93 and 94 AND the second phase signal φ2 with the bypass select signal U and the buffer select signal B, respectively. The AND gate 91 outputs a select signal Uφ1 for operating the switch 20a in a closed circuit state for selecting the bypass circuit 17 during the first phase of the operating cycle when the input signal applied to the conditioning circuit 80 is to be applied to the first input capacitor $C_{ina}$ unbuffered. The AND gate 92 outputs a select signal Bφ1 for operating the switch 19a in the closed circuit state or selecting the buffer circuit 16 during the first phase of the operating cycle, when the input signal applied to the conditioning circuit 80 is to be buffered to the first input capacitor $C_{ina}$. Select signals Uφ2 and Bφ2 are outputted by the AND gates 93 and 94, respectively for selecting the bypass circuit 17 or the buffer circuit 16 during the second phase of the operating cycle when the input signal applied to the conditioning circuit 80 is to be applied to the second input capacitor $C_{inb}$ through the bypass circuit 17 unbuffered, or is to be buffered through the buffer circuit 16, respectively. The switches 83a and 83b, 84a and 84b, 85a and 85b are selectively operated by the first and second phase select signals φ1 and φ2 during the relevant phase of the operating cycle. This aspect of an integrator circuit of a sigma-delta ADC will be well known to those skilled in the art.

The conditioning circuit 80 has the advantage of reducing the number of switches required for selecting the buffer circuit or the bypass circuit, and in particular, has the advantage of reducing the number of switches in series. This, thus minimises voltage drops in the circuit.

While the conditioning circuit 80 has been described for use in conjunction with the ADC circuit 1, it will be appreciated that the conditioning circuit 80 could be used in conjunction with the ADC circuit 30, and the ADC circuit 40. When used in conjunction with the ADC circuit 40, appropriate modifications would be required, so that instead of the conditioning circuit 80 being responsive to a channel select signal, the conditioning circuit 80 would be responsive to the output from the first and second primary comparators. Needless to say, the conditioning circuit 80 could also incorporate a buffer circuit similar to the buffer circuit of the conditioning circuit 50.

While some of the conditioning circuits have been described for use in conjunction with a chopped ADC, it will be appreciated that the conditioning circuits could be used in conjunction with the ADC circuit 1, however, in which case, in general, it is envisaged that only a single conditioning circuit would be required. Needless to say, where an ADC circuit is provided with a single conditioning circuit according to the invention, the conditioning circuit may be provided at the positive input terminal to the ADC 5 instead of the negative input terminal where it is desired to apply some of the input signals to the positive input terminal of the ADC 5 unbuffered.

While the bypass circuit has been described as a simple connection, the bypass circuit may include circuit components, and for example, may include an RC filter circuit, or other suitable or appropriate circuits.

While not described, it is envisaged that the buffer of the buffer circuit of the various conditioning circuits may be powered down when the bypass circuit has been selected, thereby minimizing power consumption by the conditioning circuit.

While the circuits according to the invention have been described as comprising a signal processing circuit which is provided by an analog to digital converter, the conditioning circuit according to the invention may be used in conjunction with any other signal processing circuit besides an analog to digital converter. Additionally while first and second primary switches have been described for isolating the buffer circuit and the bypass circuit from the ADC, other suitable switching arrangements may be used, for example, in certain cases, the output stage of the buffer may be disabled.

While the main switch circuit has been described as comprising two multiplexors, any other suitable main switch circuit may be provided, as indeed may any other suitable primary and secondary switching circuits be provided besides those described.

While the buffers have been described as each having a gain of one, buffers with other gains, greater or lesser than one could be provided. Additionally, while the buffers have been described as being implemented as operational amplifiers, any other suitable buffers may be provided, such as, for example, a simple source follower.

What is claimed is:

1. A conditioning circuit for selectively buffering an input signal to a signal processing circuit, the conditioning circuit comprising:
    a buffer circuit operable within operating voltage range, for receiving and buffering the input signal,
    a bypass circuit for receiving the input signal, and for selectively bypassing the buffer circuit, and
    a control circuit for selecting one of the buffer circuit and the bypass circuit for passing the input signal to the signal processing circuit, so that the input signal is applied to the signal processing circuit through the bypass circuit when voltage of the input signal falls outside said operating voltage range.

2. A conditioning circuit as claimed in claim 1 in which a plurality of input signals are selectively applied to the conditioning circuit, and the control circuit is responsive to which of the input signals is selected for selecting the one of the buffer circuit and the bypass circuit.

3. A conditioning circuit as claimed in claim 2 in which the signals are applied to the conditioning circuit in response to a select signal, and the control circuit is responsive to the select signal for selecting the one of the buffer circuit and the bypass circuit.

4. A conditioning circuit as claimed in claim 1 in which the control circuit is responsive to the input signal for selecting the one of the buffer circuit and the bypass circuit.

5. A conditioning circuit as claimed in claim 1 in which the control circuit is responsive to the voltage of the input signal for selecting the one of the buffer circuit and the bypass circuit.

6. A conditioning circuit as claimed in claim 5 in which the control circuit comprises a primary comparing circuit for comparing a voltage of the input signal with a reference voltage for determining if the voltage of the input signal is within said operating voltage range and the control circuit is responsive to the primary comparing circuit for selecting the one of the buffer circuit and the bypass circuit.

7. A conditioning circuit as claimed in claim 6 in which the primary comparing circuit comprises a first primary comparator for comparing the voltage of the input signal with a first reference voltage for determining if the voltage of the input signal exceeds an upper operating voltage limit of the operating voltage range of the buffer circuit, and a second primary comparator for comparing the voltage of the input signal with a second reference voltage for determining if the voltage of the input signal is below a lower operating voltage limit of the operating voltage range of the buffer circuit, the first reference voltage being higher than the second reference voltage.

8. A conditioning circuit as claimed in claim 5 in which the buffer circuit comprises a first buffer circuit and a second buffer circuit connected in parallel, each of the first and second buffer circuits operable within a respective operating voltage range, said operating voltage ranges overlapping such that the operating voltage range within which the first buffer circuit is operable has an upper operating voltage limit higher than the upper operating voltage limit of the second buffer circuit and the operating voltage range of the second buffer circuit has a lower operating voltage limit lower than the lower operating voltage limit of the first buffer circuit, the respective first and second buffer circuits being alternately selectable so that if the voltage of the input signal exceeds the upper operating voltage limit of the second buffer circuit, the input signal is passed through the first buffer circuit, and if the voltage of the input signal falls below the lower operating voltage limit of the first buffer circuit, the input signal is passed through the second buffer circuit.

9. A conditioning circuit as claimed in claim 8 in which the control circuit comprises a secondary comparator for comparing the voltage of the input signal with an intermediate reference voltage, the control circuit being responsive to the secondary comparator for selecting one of the first and second buffer circuits for passing the input signal to the signal processing circuit.

10. A conditioning circuit as claimed in claim 9 in which the intermediate reference voltage is selected to lie between the lower operating voltage limit of the first buffer circuit and the upper operating voltage limit of the second buffer circuit.

11. A conditioning circuit as claimed in claim 1 in which a primary switching circuit is provided for selectively switching the input signal through the one of the buffer circuit and the bypass circuit, the primary switching circuit being responsive to the control circuit for selecting the one of the buffer circuit and the bypass circuit through which the input signal is to be passed to the signal processing circuit.

12. A conditioning circuit as claimed in claim 11 in which the primary switching circuit comprises a first primary switch located in the buffer circuit for isolating the buffer circuit from the signal processing circuit, and a second primary switch located in the bypass circuit for isolating the bypass circuit from the signal processing circuit, the respective first and second primary switches being responsive to the control circuit such that when one of the first and second primary switches is in a closed circuit state for selecting the corresponding one of the buffer circuit and the bypass circuit, the other of the first and second primary switches is in an open circuit state.

13. A conditioning circuit as claimed in claim 8 in which a secondary switching circuit is provided for selectively passing the input signal through one of the first and second buffer circuits.

14. A conditioning circuit as claimed in claim 1 in which the conditioning circuit is implemented as an integrated circuit.

15. A conditioning circuit as claimed in claim 1 in which the conditioning circuit is adapted for selectively buffering the input signal to an analog to digital converter.

16. A circuit comprising:
   a signal processing circuit for processing a plurality of input signals,
   a main switch circuit for selectively switching at least one of the plurality of input signals to the signal processing circuit, and
   at least one conditioning circuit for selectively buffering the input signals received from the main switch circuit to the signal processing circuit, each conditioning circuit comprising:
      a buffer circuit operable within an operating voltage range, for buffering the input signals,
      a bypass circuit for selectively bypassing the buffer circuit, and
      a control circuit for selecting one of the buffer circuit and the bypass circuit for passing the selected input signals to the signal processing circuit, so that the input signals, voltages of which fall outside said operating voltage range, are passed to the signal processing circuit through the bypass circuit.

17. A circuit as claimed in claim 16 in which the signal processing circuit comprises two input terminals for receiving positive signals of the selected input signals and negative signals of the selected input signals from the main switch circuit, and the conditioning circuit is located for passing the positive or negative signals of the selected input signals from the main switch circuit to one of the input terminals of the signal processing circuit.

18. A circuit as claimed in claim 17 in which one of the input terminals of the signal processing circuit is a positive input terminal, and the other input terminal of the signal processing circuit is a negative input terminal, and two conditioning circuits are provided, one conditioning circuit being located for passing either the positive or negative signals of the selected input signals from the main switch circuit to the positive input terminal of the signal processing circuit, and the other conditioning circuit being located for passing the others of the positive and negative signals of the selected input signals from the main switch circuit to the negative input terminal of the signal processing circuit.

19. A circuit as claimed in claim 18 in which the main switch circuit is operable for alternately applying the positive and negative signals of the selected input signals to each of the positive and negative input terminals of the signal processing circuit.

20. A circuit as claimed in claim 16 in which the main switch circuit is responsive to a select signal for selecting the input signals, and the control circuit of each conditioning circuit is responsive to the select signal for selecting the one of the buffer circuit and the bypass circuit.

21. A circuit as claimed in claim 16 in which the control circuit of each conditioning circuit is responsive to the voltage of the selected input signal received by the conditioning circuit for selecting the one of the buffer circuit and the bypass circuit.

22. A circuit as claimed in claim 21 in which the control circuit of each conditioning circuit comprises a primary comparing circuit for comparing the voltage of the input signal received by the conditioning circuit with a reference voltage for determining if the voltage of the input signal is within the operating voltage range of the buffer circuit, and the control circuit is responsive to the primary comparing circuit for selecting the one of the buffer circuit and the bypass circuit.

23. A circuit as claimed in claim 22 in which the primary comparing circuit of each conditioning circuit comprises a first primary comparator for comparing the voltage of the input signal received by the conditioning circuit with a first reference voltage for determining if the voltage of the input signal exceeds an upper operating voltage limit of the operating voltage range of the buffer circuit, and a second primary comparator for comparing the voltage of the input signal with a second reference voltage for determining if the voltage of the input signal is below a lower operating voltage limit of the operating voltage range of the buffer circuit, the first reference voltage being higher than the second reference voltage.

24. A circuit as claimed in claim 21 in which the buffer circuit of each conditioning circuit comprises a first buffer circuit and a second buffer circuit connected in parallel, the first and second buffer circuits having respective overlapping operating voltage ranges, the operating voltage range of the first buffer circuit having an upper operating voltage limit higher than the upper operating voltage limit of the second buffer circuit, and the operating voltage range of the second buffer circuit having a lower operating voltage limit lower than the lower operating voltage limit of the first buffer circuit, the respective first and second buffer circuits being alternately selectable so that if the voltage of the input signal exceeds the upper operating voltage limit of the second buffer circuit, the input signal is passed through the first buffer circuit, and if the voltage of the input signal falls below the lower operating voltage limit of the first buffer circuit, the input signal is passed through the second buffer circuit.

25. A circuit as claimed in claim 24 in which the control circuit of each conditioning circuit comprises a secondary comparator for comparing the voltage of the input signal received by the conditioning circuit with an intermediate reference voltage, the control circuit being responsive to the secondary comparator for selecting one of the first and second buffer circuits for passing the input signal to the signal processing circuit.

26. A circuit as claimed in claim 16 in which each conditioning circuit comprises a primary switching circuit for selectively switching each input signal received by the conditioning circuit through the one of the buffer circuit and the bypass circuit, the primary switching circuit being responsive to the control circuit for selecting the one of the buffer circuit and the bypass circuit through which the input signal is to be passed to the signal processing circuit.

27. A circuit as claimed in claim 24 in which each conditioning circuit comprises a secondary switching circuit for selectively passing the input signal received by the conditioning circuit through one of the first and second buffer circuits.

28. A circuit as claimed in claim 16 in which the signal processing circuit is an analog to digital converter.

29. A circuit as claimed in claim 16 in which the circuit is implemented as an integrated circuit.

30. An analog to digital converter circuit comprising:
an analog to digital converter for converting a plurality of analog input signals to digital signals,
a main switch circuit for selectively switching at least one of the plurality of analog input signals to the analog to digital converter, and
at least one conditioning circuit for receiving and selectively buffering the input signals received from the main switch circuit to the analog to digital converter, each conditioning circuit comprising:
a buffer circuit operable within an operating voltage range, for buffering the input signals,
a bypass circuit for selectively bypassing the buffer circuit, and
a control circuit for selecting one of the buffer circuit and the bypass circuit for passing the selected input signals to the analog to digital converter, so that the input signals, voltages of which fall outside said operating voltage range, are passed to the analog to digital converter through the bypass circuit.

31. An analog to digital converter circuit as claimed in claim 30 in which in a sampling phase of a conversion cycle of the analog to digital converter an input capacitor is charged in response to a coarse phase signal and a fine phase signal, and the control circuit is responsive to the coarse phase signal so that the buffer circuit of each conditioning circuit is always selected during the coarse charging phase of the input capacitor of the analog to digital converter.

32. An analog to digital converter circuit as claimed in claim 30 in which a primary switching circuit is provided for selectively switching the input signals through the one of the buffer circuit and the bypass circuit of each conditioning circuit, the primary switching circuit being responsive to the control circuit for selecting the one of the buffer circuit and the bypass circuit through which the input signal is to be passed to the analog to digital converter.

33. An analog to digital converter circuit as claimed in claim 32 in which the primary switching circuit is implemented by switches of the analog to digital converter.

34. A method for buffering an input signal to a signal processing circuit, the method comprising the steps of:
providing a buffer circuit operable within an operating voltage range, for buffering the input signal,
providing a bypass circuit for selectively bypassing the buffer circuit, and
selecting one of the buffer circuit and the bypass circuit for passing the input signal to the signal processing circuit so that the input signal is applied to the signal processing circuit through the bypass circuit when voltage of the input signal falls outside said operating voltage range.

* * * * *

UNITED STATES PATENT AND TRADEMARK OFFICE
CERTIFICATE OF CORRECTION

PATENT NO.     : 6,697,006 B1
DATED          : February 24, 2004
INVENTOR(S)    : Damien Joseph McCartney et al.

It is certified that error appears in the above-identified patent and that said Letters Patent is hereby corrected as shown below:

Column 1,
Line 30, should read -- the bridge. The voltages of a differential signal generally do --.
Line 46, should read -- has a positive polarity. Conversely, if the positive signal is --.
Line 65, should read -- circuit or other signal processing circuit is undesirable. --.

Column 2,
Line 9, should read -- a limited input voltage range. They are unsuitable for --.
Line 25, should read -- buffer can operate, in general, extends closer to the negative --.

Column 11,
Line 11, should read -- 8 and the condition circuit 15a to the positive input --.
Line 54, should read -- positive input terminal 6 of the ADC 5. However, the control --.
Line 66, should read -- second primary switches 19a and 20a of the respective --.

Column 12,
Line 21, should read -- already described with reference to the ADC circuit 30. The --.

Column 14,
Line 54, should read -- generated by a clock generator 72 which may be located in --.

Column 15,
Line 30, should read -- the coarse phase signal, $\phi$coarse. The first primary switch 19 --.
Line 57, should read -- second stage circuit 54 of the conditioning circuit 50. In --.

Column 17,
Line 8, should read -- state for selecting the buffer circuit 16 during the first phase --.

UNITED STATES PATENT AND TRADEMARK OFFICE
CERTIFICATE OF CORRECTION

PATENT NO. : 6,697,006 B1
DATED : February 24, 2004
INVENTOR(S) : Damien Joseph McCartney et al.

It is certified that error appears in the above-identified patent and that said Letters Patent is hereby corrected as shown below:

Column 18,
Line 22, should read -- a buffer circuit operable within an operating voltage range, --.
Line 51, should read -- comparing the voltage of the input signal with a reference --.
Line 53, should read -- within said operating voltage range, and the control circuit is --.

Signed and Sealed this

Twenty-first Day of February, 2006

JON W. DUDAS
*Director of the United States Patent and Trademark Office*